(12) United States Patent
Yousef et al.

(10) Patent No.: US 10,880,115 B2
(45) Date of Patent: Dec. 29, 2020

(54) METHOD FOR PERFORMING A DATA COMMUNICATION

(71) Applicant: Aptiv Technologies Limited, St. Michael (BB)

(72) Inventors: Sebastian Yousef, Bochum (DE); Victor Tolentino, Wuppertal (DE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 16/382,694

(22) Filed: Apr. 12, 2019

(65) Prior Publication Data

US 2019/0356507 A1    Nov. 21, 2019

(30) Foreign Application Priority Data

May 17, 2018   (EP) ..................................... 18172794

(51) Int. Cl.
| | | |
|---|---|---|
| *H04L 12/40* | (2006.01) | |
| *H03M 5/12* | (2006.01) | |
| *H04L 5/14* | (2006.01) | |
| *H04L 12/44* | (2006.01) | |

(52) U.S. Cl.
CPC .............. *H04L 12/40* (2013.01); *H03M 5/12* (2013.01); *H04L 5/14* (2013.01); *H04L 12/44* (2013.01)

(58) Field of Classification Search
CPC . H04L 12/40; H04L 5/14; H04L 12/44; H04L 69/08; H04L 27/00; H03M 5/12; G06F 13/4072; G08C 19/00
See application file for complete search history.

(56) References Cited

U.S. PATENT DOCUMENTS

| | | | | | |
|---|---|---|---|---|---|
| 5,657,324 | A | * | 8/1997 | Itkin ......................... | H04L 5/14 307/2 |
| 7,860,173 | B2 | * | 12/2010 | Linnman .............. | H04B 14/026 375/257 |
| 2003/0036819 | A1 | * | 2/2003 | Lehr ....................... | H04L 12/44 700/286 |
| 2011/0022753 | A1 | * | 1/2011 | Ingels ................. | G06F 13/4286 710/106 |
| 2014/0095749 | A1 | * | 4/2014 | Lambrechts ........ | G06F 13/4063 710/104 |

(Continued)

FOREIGN PATENT DOCUMENTS

| | | |
|---|---|---|
| DE | 103 06 044 A1 | 9/2004 |
| EP | 0695055 | 1/1996 |

OTHER PUBLICATIONS

"Iq: What it is, what it isn't, and how to use it"; Glaser et al. (Texas Instruments Inc.); Analog Applications Journal; 2011 (Year: 2011).*

(Continued)

*Primary Examiner* — Benjamin H Elliott, IV
(74) *Attorney, Agent, or Firm* — Colby Nipper PLLC

(57) ABSTRACT

A method for performing a data communication between at least two devices, wherein, the at least two devices are connected via an electrical bus line, each of the devices detects the magnitude of a device current flowing from the respective device to the bus line, one device increases the device current of the other devices in order to announce the transfer of data, and data is transferred after announcing the transfer of data by means of modulation of the device current of the other devices.

20 Claims, 3 Drawing Sheets

(56) References Cited

U.S. PATENT DOCUMENTS

2015/0169488 A1* 6/2015 Metzner .............. G06F 13/4022
710/316
2015/0280783 A1* 10/2015 Seifried ............ H04L 12/40045
375/239
2018/0183623 A1* 6/2018 Schoenfeld ............. H04L 67/12
2019/0028307 A1* 1/2019 Ulrich ............... H04L 25/03343
2019/0251054 A1* 8/2019 Teutenberg ......... G06F 13/4022
2019/0356507 A1* 11/2019 Yousef .................... H03M 5/12
2019/0385057 A1* 12/2019 Litichever ........... H04L 63/1416

OTHER PUBLICATIONS

"Extended European Search Report", EP Application No. 18172794. 2, dated Nov. 27, 2018, 5 pages.

* cited by examiner

METHOD FOR PERFORMING A DATA COMMUNICATION

TECHNICAL FIELD OF INVENTION

This disclosure generally relates to a method for performing a data communication between at least two devices.

BACKGROUND OF INVENTION

Methods for performing data communications are widely used in different applications. For example, in automotive applications, there exists an increasing demand for data processing which requires data communication. Particularly, in autonomous or semi-autonomous driving applications, different processing units (e.g. systems on chip—SOCs) need to exchange data. This data communication requires a high functional safety. However, at the same time, data communication should be implemented without generating high costs. Additionally, further aspects, e.g. stability against electromagnetic interferences (EMI) should be provided.

SUMMARY OF THE INVENTION

Described herein is a method for performing a data communication between at least two devices, which allows a safe and reliable transmission of data, wherein the method can preferably be implemented at low costs.

One embodiment relates to a method for performing a data communication between at least two devices, wherein the at least two devices are connected via an electrical bus line, each of the devices detects the magnitude of a device current flowing from the respective device to the bus line, one device increases the device current of the other devices in order to announce the transfer of data, data is transferred by the one device after announcing the transfer of data by means of modulation of the device current of the other devices.

In other words, the one device that increases the device current of the other devices thereby claims the bus priority (i.e. becomes master), whereas the other devices then preferably switch into a slave mode/receiving mode, wherein the other devices wait to receive data from the one device (i.e. the master). After the master has announced the transfer of data by increasing the device current of the other devices, e.g. by increasing the device current for a predetermined length of time, for example 1 ms, the master modulates the device current of the other devices. By means of this modulation of the device current of the other devices, data is transferred from the master to the other devices.

According to one embodiment, it is thus possible to perform a data communication by simply first increasing and then modulating the device current of the other devices. Thereby, a data communication that is robust against electromagnetic interferences can be realized. At the same time, increasing and modulating the device current does not require excessive circuitry, thereby allowing the data communication to be implemented at low costs. Due to the reliability of the data communication, the method of the invention can be used in safety related functions, e.g. in Advanced Driver Assistance Systems (ADAS).

In this respect, the device current is the current flowing from the respective device into the bus line and/or the current flowing from the bus line into the respective device, i.e. a positive or negative current. In other words, the device current is the current exchanged by a specific device with the bus line.

Preferably, each of the devices connected to the electrical bus line can in turn be connected to a processing unit, e.g. via a data interface, wherein the devices translate information received from the respective processing unit to be transmitted via the electrical bus line.

It is to be understood that "increasing the device current" can mean "increasing the magnitude of the device current" and/or "increasing the absolute value of the device current".

The devices that communicate over the bus line are herein referred to as "bus devices" or as "devices".

Preferable features and embodiments of the present invention are disclosed in the description, in the Figures and in the dependent claims.

Preferably, the devices perform a bidirectional data communication using the electrical bus line wherein also at least one of the other devices announces the transfer of data after a previous transfer of data has been completed. This means that preferably every device can become master. However, only one master at a time can be allowed. Thus, also every device can become a slave and thus receive the data sent by the master.

For example, a first device can initially be the one device that increases the device current of the other devices in order to announce the transfer of data. The first device then transfers the data by means of modulating the device current of the other devices. After the transfer of data a second device then increases the device current of the other devices and thereby also the device current of the first device. Thereby the second device becomes the one device/the master. The second device then transfers the data by modulating the device current of the other devices.

Advantageously, more than two devices are connected via the electrical bus line, wherein the electrical bus line comprises a star topology. In other words, more than two devices (or all devices) are electrically connected to the same electrical bus line. Every device can be directly electrically connected to each other device.

Further advantageously, the devices draw a (positive or negative) quiescent current from the electrical bus line, at least when no transfer of data occurs. The quiescent current bears the advantage that the devices can easily detect errors of the bus, e.g. if the quiescent current fails (i.e. is reduced to zero). To provide the quiescent current, the devices can comprise an idle resistor that facilitates that the quiescent current flows from the bus line to ground, wherein the idle resistors of different devices preferably have different Ohmic resistances. Particularly, the idle resistor can be directly connected to ground and the bus line. The different Ohmic resistances then can trigger the quiescent current. The Ohmic resistances of the different devices can differ by at least +/−10% or by at least +/−15%. Alternatively, the different Ohmic resistances can be achieved by digitally programming the devices.

In case it is detected that the quiescent current would be zero (despite a correct function of the bus line), then the Ohmic resistance of the idle resistor can be changed, e.g. by connecting one or more adjustment resistors to the idle resistor (in series and/or in parallel). Connecting the adjustment resistors can be performed either during a setup process or during operation. The adjustment resistors can then lead to a non-zero quiescent current.

In order to detect the quiescent current, a voltage drop at the idle resistor can be detected, e.g. by means of an operation amplifier. Of course, different ways of detecting the quiescent current are also possible.

A correct functioning of the bus line can be assumed if the quiescent current is different from the quiescent current that would be present if no other device would be connected to the bus line. In case a bus failure is detected, e.g. by means of detecting the quiescent current, the bus device can then output a warning signal.

During the transfer of data by means of modulation of the device current, preferably, the device current is modulated using Manchester code. In Manchester code the encoding of each data bit is either low then high, or high then low, for equal time. The modulation of the device current can thus provide a self-clocking signal, preferably having no direct current (DC) component. Due to the use of Manchester code, the electrical bus line and the devices communicating over the electrical bus line can be easily galvanically isolated.

Advantageously, during the transfer of data, first an address of a target device is transmitted followed by the data designated for the target device. For example, a first transmitted byte can comprise the address of the target device (i.e. one of the bus devices). Then, one or more bytes of data designated for the target device (i.e. the payload) can be transmitted. The target device is one of the slave devices that receive data. The payload can also include a request for data, wherein the request can include the address of the requesting device, which then triggers the target device to become master and send the requested data to the requesting device. Each of the devices can have a unique ID, i.e. a unique address.

Preferably the data communication between the devices using the modulated device current only uses a single electrical bus line. In other words, the bus line realizes a single wire connection against ground. The use of a single electrical bus line preferably means that except from the electrical bus line, no other electrical connection that transfers data from one bus device to the another is present.

The devices preferably can have a modulating resistor ($R_{high}$), which can be switched between the bus line and ground, e.g. by means of a transistor. When the modulating resistor is connected between the bus line and ground, this can lead to a higher device current in the other devices. For this purposes, the modulating resistor can have an Ohmic resistance which is lower than the Ohmic resistance of the idle resistor, e.g. below 1 k$\Omega$ or preferably around 500$\Omega$.

The modulating resistor ($R_{high}$) can be switched by a modulating transistor. The modulating resistor and the modulating transistor can be connected in series. The series connection of the modulating resistor ($R_{high}$) and the modulating transistor can be connected in parallel to the idle resistor, i.e. between the bus line and ground. When the modulating transistor becomes conductive (switched on), the modulating resistor ($R_{high}$) is then conductively arranged between the bus line and ground. The additional current through the modulating resistor ($R_{high}$) can then increase the device current of the other devices. The modulating transistor can also modulate the current for the transfer of data, by repeated switching operations.

Advantageously, the electrical bus line is only arranged on a printed circuit board (PCB), preferably having direct contact with the substrate of the PCB at more than 50% of its length. In other words, the electrical bus line is only used for connecting bus devices on a PCB, e.g. for indirectly connecting different systems on chip (SOCs) on the same PCB. The SOCs preferably may be configured as Advanced Driver Assistance Systems (ADAS).

It is further preferred, if only one device at a time increases the device current of the other devices. Thus, only one of the devices can become the one device (master) thereby eliminating problems occurring when several devices simultaneously try to transmit data. Due to first increasing the device current of the other devices, the other devices are immediately informed that the one device would like to transmit data. In this event, the other devices refrain from claiming bus priority, i.e. increasing the device current of the other devices themselves. Instead the other devices wait until the transfer of data of the one device is completed.

Preferably, during increasing the device current of the other devices and/or after the device current of the other devices has been increased, the one device switches off its receiver section (see below), i.e. cannot receive data anymore.

The invention further relates to a device for performing a data communication, wherein the device is adapted to be connected to an electrical bus line, detect the magnitude of a device current flowing from the device to the bus line, increase the device current of other devices connected to the bus line in order to announce the transfer of data, transfer data after announcing the transfer of data by modulating the device current of the other devices, and receive data by detecting a modulation of its device current.

The device preferably comprises a sense resistor ($R_{sense}$) which is e.g. connected between a supply voltage ($V_{DD}$) and the bus line if a sense transistor is in a conducting state. In other words, the sense resistor ($R_{sense}$) and the sense transistor can be connected in series, wherein the series connection is connected to the supply voltage and the bus line. If the sense transistor is in the conducting state, it is possible to detect changes in the device current via the voltage drop at the sense resistor. Thereby, it is possible to detect if another device has increased the device current and/or if data is transmitted using modulation of the device current.

For the sake of clarity, it is noted that the device current can include the quiescent current. However, with the sense resistor ($R_{sense}$) it may only be possible to detect a current which equals the device current without the quiescent current.

As mentioned before, the device preferably also comprises a modulating resistor ($R_{high}$) which is connected between the bus line and ground if a modulating transistor is in a conductive state. It is to be noted that usually only one of the sense transistor and the modulating transistor is in a conductive state. For example, if the modulating transistor is in a conductive state, the sense transistor is switched off thereby electrically separating the sense resistor from the electrical bus line. When the sense resistor is separated from the electrical bus line, no increased or modulated device current can be detected. Thus, the receiver section of the device (i.e. the sense resistor) is switched off.

Also, if the sense transistor is in a conductive state, then the modulating transistor is preferably switched off. In case the bus device does not want to transmit data, the bus device preferably remains in a receiving state (slave). In the receiving state, the sense transistor is in a conductive state, whereas the modulating transistor is not in a conductive state.

When the modulating resistor is switched between the bus line and ground, the modulating resistor draws a current from the bus line, thereby increasing the device current of the other devices. In the same manner, the modulating transistor and the modulating resistor can be used to modulate the device current of the other devices to transfer data.

The invention further relates to a bus system comprising at least two devices, preferably at least 5 devices, as described above. The devices are connected via a single electrical bus line. As mentioned before, the devices are connected via a single wire electrical bus line (against ground).

Preferably, each of the devices of the bus system comprises a data interface to a processing unit, wherein the devices transfer interface data received from the data interface via the electrical bus line. In other words, each processing unit (e.g. a SOC) can be directly connected to one of the bus devices, wherein the respective device is directly connected to the electrical bus line. The data interface between the processing unit and the respective device e.g. comprises several parallel data lines, e.g. eight parallel electrical data lines. Alternatively, or additionally, the processing unit and the respective device can be connected via SPI (Serial Peripheral Interface). The data interface can provide a higher data transfer speed than the data transmission over the electrical bus line. The device can then comprise a buffer which temporarily stores data received via the data interface from the processing unit until this data is transferred via the electrical bus line. The data transfer speed over the electrical bus line can be between 100 kbit to 1 Mbit, preferably around 400 kbit.

The devices preferably are formed as integrated circuits (ICs) and/or as ASICs (application specific integrated circuits).

During operation of the bus system, one of the processing units transfers data via the data interface to its connected bus device. The bus device receives this data and then disconnects its sense resistor ($R_{sense}$) and connects its modulating resistor ($R_{high}$) between the electrical bus line and ground. Thereby, an increased current flows through the modulating resistor and thus increases the device current of the other devices also connected to the electrical bus line. The other devices understand the increased device current as a signal to expect the transfer of data.

The one device, i.e. the device that has increased the device current of the other devices, then transfers data by repeatedly temporarily switching the modulating resistor between the bus line and ground (by means of the modulating transistor). Via the modulated device current of the other devices first an address of the target device is transmitted. Then a payload (i.e. the actual data) is transmitted. All data is preferably transmitted using Manchester coding.

The target device then receives the payload and transfers the payload to the processing unit which is coupled via the data interface to the target device. If the payload comprises a request for data, then the target device can—in turn—increase the device current of the other devices and after that transfers back the requested data.

As an example only, a supply voltage of the devices can be around 3.3 V or 5 V. The quiescent device current can be between 0.05 and 2 mA, preferably between 0.1 and 1 mA. When the device current is increased, the device current can be increased by a factor between 5 and 25, preferably by a factor of 10.

It is to be understood that the voltages mentioned herein usually refer to a voltage against ground, if not otherwise stated.

The Ohmic resistance of the sense resistor preferably is in a range between 0.5 and 50 SI, particularly between 5 and 25 SI. The modulating resistor can have an Ohmic resistance in the range of 100Ω to 2 kΩ, preferably 300Ω to 500Ω.

It is to be noted that the disclosure made herein with respect to the method of the invention also holds true for the inventive device and the inventive bus system.

Further features and advantages will appear more clearly on a reading of the following detailed description of the preferred embodiment, which is given by way of non-limiting example only and with reference to the accompanying drawings.

BRIEF DESCRIPTION OF DRAWINGS

Further details will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
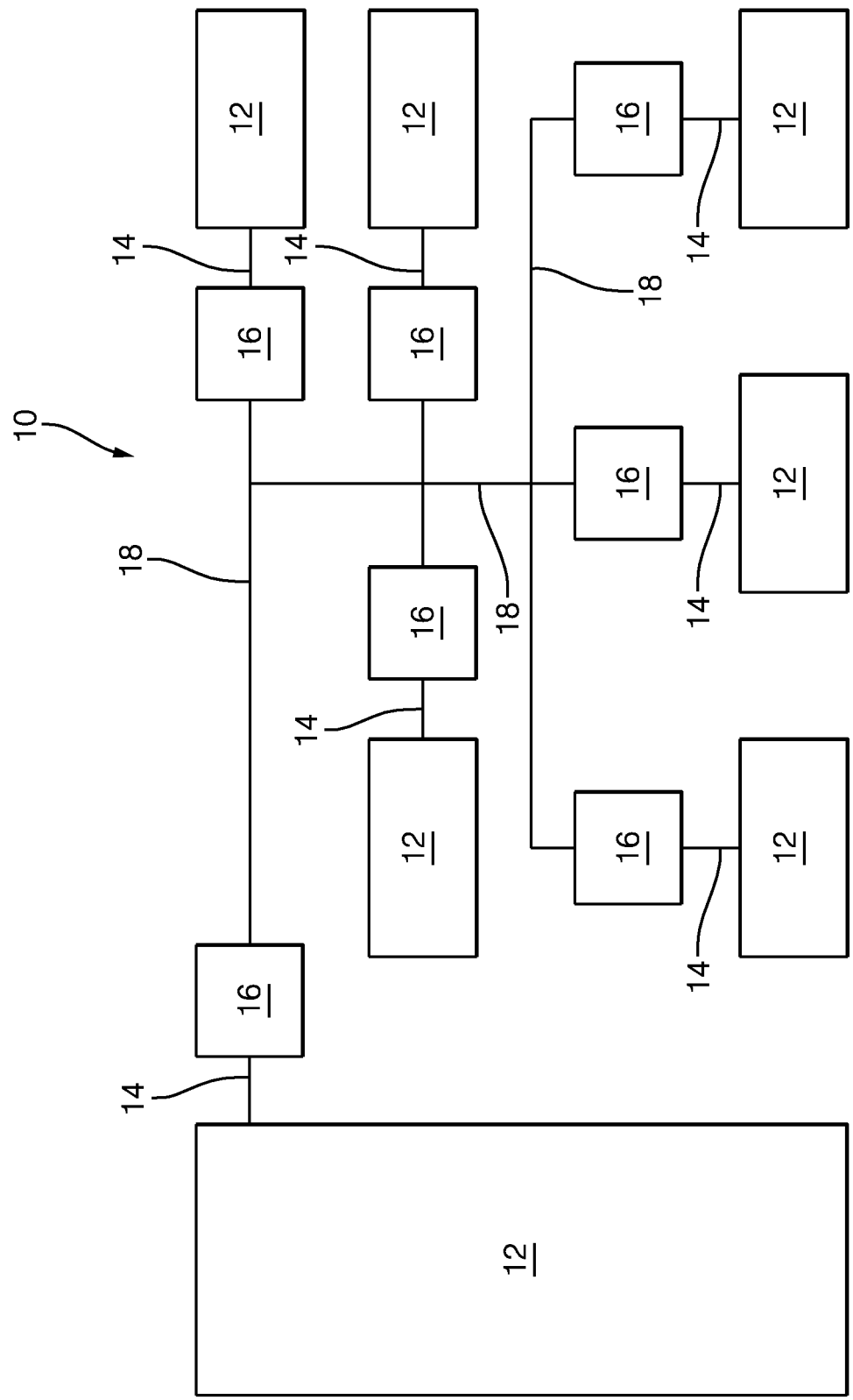
FIG. 1 shows a schematic view of a bus system.

FIG. 1 shows a bus system 10 comprising seven processing units in the form of systems on chip, SOCs 12. Each SOC 12 is coupled via a parallel data interface 14 to one bus device 16. Thus, the bus system 10 comprises seven bus devices 16. The bus devices 16 are all directly connected to one single electrical bus line 18. The bus devices 16 are also connected to ground (not shown in FIG. 1).

As can be seen in FIG. 1, the bus line 18 comprises a star topology.

Figure 2:
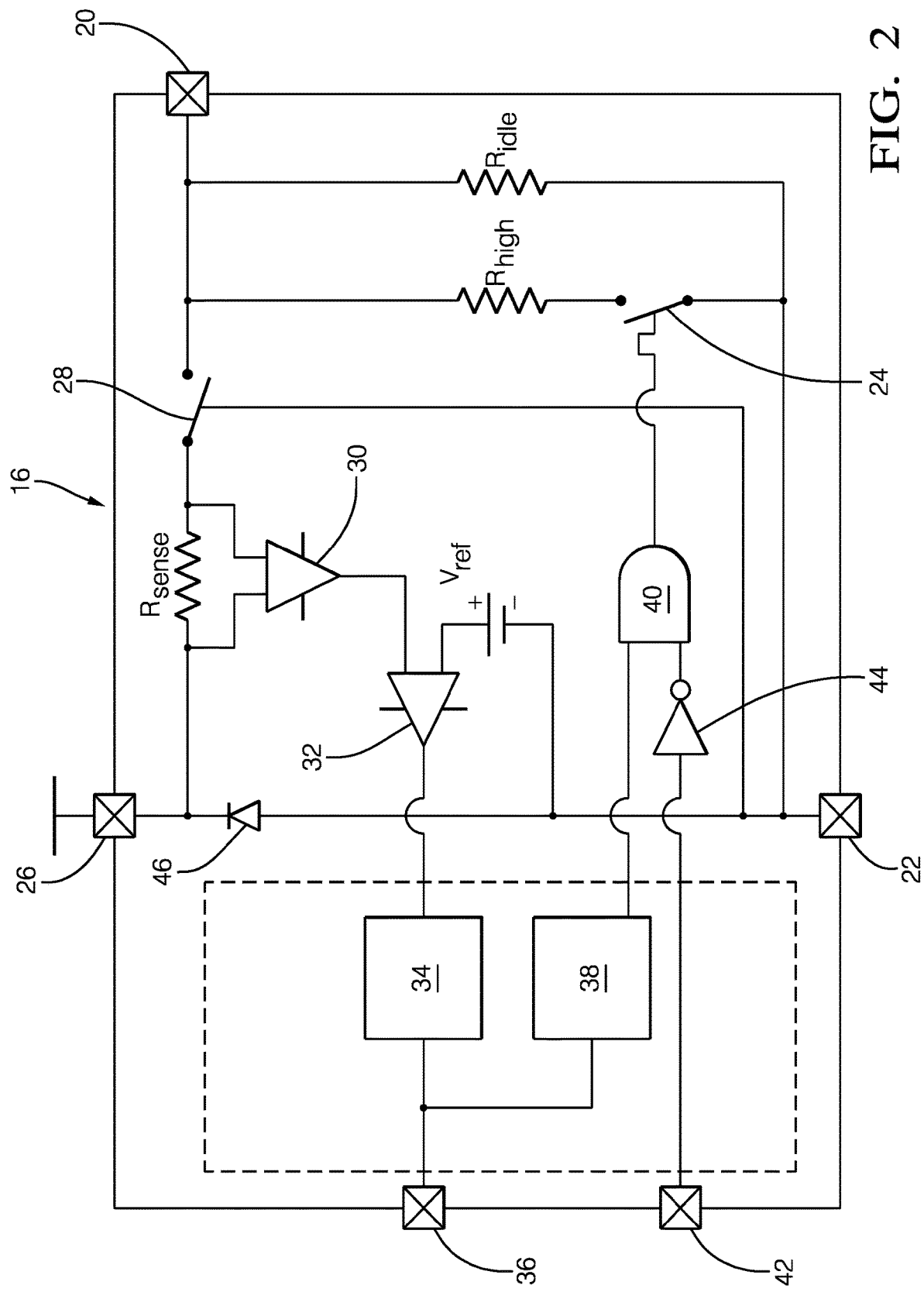
FIG. 2 shows the internal structure of one of the devices.

FIG. 2 shows the internal structure of one of the bus devices 16. The bus device comprises a bus pin 20 that is directly electrically connected to the bus line 18. The bus device 16 furthermore comprises a ground pin 22 which is electrically connected to ground. Between the bus pin 20 and the ground pin 22 an idle resistor $R_{idle}$ is connected. The idle resistor $R_{idle}$ has an Ohmic resistance of around 3 kΩ. The idle resistors $R_{idle}$ of the different bus devices 16 differ in their Ohmic resistance to realize a quiescent current.

Parallel to the idle resistor $R_{idle}$ there is arranged a modulating resistor $R_{high}$ which is arranged in series with a modulating transistor 24. When the modulating transistor 24 is in a conductive state, then a current can flow from the bus pin 20 to the ground pin 22 through the modulating resistor $R_{high}$.

The bus device 16 also comprises a supply pin 26 which is connected to a supply voltage of around 3.3 V. Between the supply pin 26 and the bus pin 20 there are arranged a sense resistor $R_{sense}$ and a sense transistor 28 in series.

A first operation amplifier (OpAmp) 30 is provided to detect the voltage drop over the sense resistor $R_{sense}$. For this purpose, each of the two inputs of the first OpAmp 30 are connected to one of the terminals of the sense resistor $R_{sense}$. A second OpAmp 32 receives the output of the first OpAmp 30 and compares it with a reference voltage $V_{ref}$. The output of the second OpAmp 32 is fed into a decoder 34 which translates the protocol used by the bus devices 16 into a protocol that is used by the SOCs 12. The decoder 34 is coupled at its output side to a receive and transmit-pin 36.

The receive and transmit-pin 36 is also coupled to an encoder 38 which translates the protocol used by the SOCs 12 into the protocol used by the bus devices 16 (i.e. Manchester coding). The output of the encoder 38 is coupled via an adder 40 with the modulating transistor 24 such that the encoder 38 can control the switching behavior of the modulating transistor 24. The control of the switching behavior of the modulating transistor 24 is only possible when a read/write-pin 42 is at a low voltage level. The read/write-pin 42 is also connected to the adder 40 via an inverter 44. Thus, the modulating transistor 24 can only modulate the current flowing through the modulating resistor $R_{high}$ if the read/write-pin 42 is pulled low.

The bus device 16 finally comprises a safety diode 46 which is coupled between the supply pin 26 and the ground pin 22, wherein its cathode is coupled to the supply pin 26.

It has to be noted that the decoder 34 and the encoder 38 could also be implemented in the SOC 21, particularly in software of the SOC 12.

The read/write-pin 42 is also coupled to the sense transistor 28 such that the sense transistor 28 is in a non-conductive state when the read/write-pin 42 is pulled low. Thus, during transmission of data by the bus device 16, the voltage at the sense resistor $R_{sense}$ is zero.

In case the bus device 16 receives data from its connected SOC 12, then the read/write-pin 42 is pulled low and data is received via the receive and transmit-pin 36. Then, the sense transistor 28 is opened and the modulating transistor 24 is closed. The closing of the modulating transistor 24 leads to an increased device current of the other bus devices 16, i.e. an increased current through the respective sense resistor $R_{sense}$ of the other bus devices 16. After this phase of increased current, the data to be transmitted is modulated by closing and opening the modulating transistor 24, which leads to a modulated current through the sense resistors $R_{sense}$ of the other devices 16. The other devices 16 can thereby receive the transmitted data.

In case data is received, the read/write-pin 42 is pulled high thereby opening the modulating transistor 24 and closing (i.e. bringing it into a conductive state) the sense transistor 28. The modulated current through the sense resistor $R_{sense}$ can then be detected by the OpAmps 30, 32 and decoded by the decoder 34 and finally outputted at the receive and transmit-pin 36.

Figure 3:
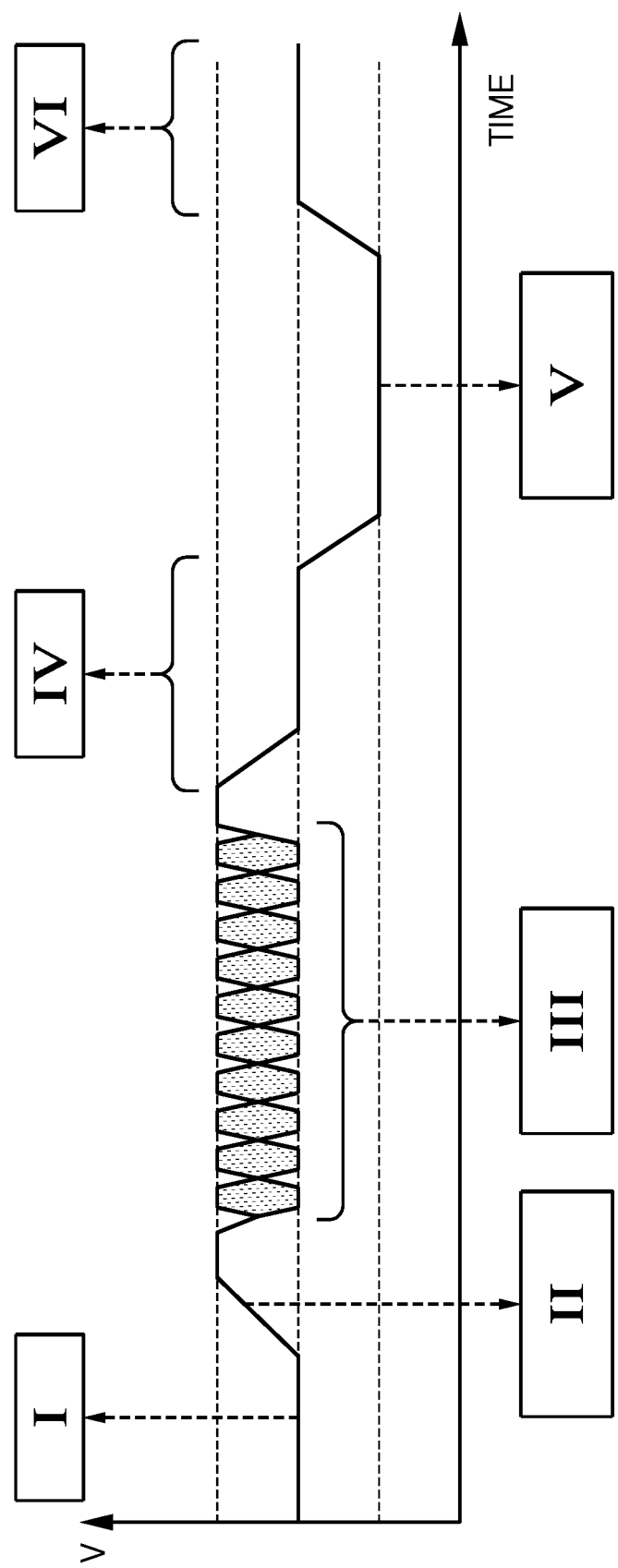
FIG. 3 shows voltages at the sense resistor over time.

FIG. 3 shows these different stages in a diagram of the voltage at the sense resistor $R_{sense}$ over time. The voltage at the sense resistor $R_{sense}$ indicates changes in the device current (i.e. the current flowing through the bus pin 20). In a first sector I the voltage is at an idle voltage, meaning that no activity is present. In a second sector II the voltage (and thus the current through the sense resistor $R_{sense}$) is increased by another device thereby configuring the present bus device 16 as a slave or receiving device. In section III data is received using Manchester coding. After the transmission of data, the voltage returns to its idle level in section IV. If the present bus device 16 itself transmits data and is thus configured as a master, the sense resistor $R_{sense}$ is separated from the bus pin 20 by the sense transistor 28, resulting in a voltage drop to zero of the voltage at the sense resistor $R_{sense}$ (as seen in section V of FIG. 3). Finally, section VI shows the return to the idle level.

As can be seen, the above allows a secure transmission of data over a single wire bus, wherein a reliable and EMI robust transmission can be provided. While this invention has been described in terms of the preferred embodiments thereof, it is not intended to be so limited, but rather only to the extent set forth in the claims that follow.

We claim:
1. A method comprising:
connecting at least two devices via a single common node on an electrical bus line having a single wire connection against ground;
indicating an initiation of a transfer of data from a first device to a second device by increasing a current flowing between the first device and the electrical bus line; and
transferring, via the electrical bus line, the data from the first device to the second device by modulating the current flowing between the first device and the electrical bus line.
2. The method of claim 1, wherein
each of the at least two devices include a modulating transistor, wherein indicating the initiation of the transfer of the data further includes:
activating the modulating transistor of the first device; and
deactivating the modulating transistor of the second device by increasing another current flowing in the second device.
3. The method of claim 2, wherein
each of the at least two devices further include a sense transistor, wherein deactivating the modulating transistor of the second device further includes enabling a detection of an increase to the other current flowing in the second device by activating the sense transistor of the second device.

4. The method of claim 1, wherein
the method further includes the step of indicating a subsequent data transfer by the second device upon a completion of the transfer of data from the first device.

5. The method of claim 1, wherein
a plurality of devices are connected via the electrical bus line, wherein the electrical bus line comprises a star topology.

6. The method of claim 1, wherein
the at least two devices draw a quiescent current from the electrical bus line when no transfer of data occurs, and wherein each of the at least two devices include an idle resistor that facilitates that the quiescent current flows from the electrical bus line to ground.

7. The method of claim 6, wherein the idle resistors of the respective at least two devices have different Ohmic resistances.

8. The method of claim 1, wherein
the first device has priority over the second device for transferring the data to the electrical bus line, and wherein the second device is switched into a data receiving mode.

9. The method of claim 1, wherein
the step of transferring data includes, transmitting an address of a target device preceding a transmission of the data destined for the target device.

10. The method of claim 1, wherein
only one device at a time increases the current flowing to the electrical bus line.

11. An apparatus, comprising:
at least two devices connected via a single common node on an electrical bus line having a single wire connection against ground;
the at least two devices including a first device indicating an initiation of a transfer of data to a second device by increasing a current flowing between the first device and the electrical bus line; whereby
the first device transfers, via the electrical bus line, the data from the first device to the second device by modulating the current flowing between the first device and the electrical bus line.

12. The apparatus of claim 11, wherein
each of the at least two devices include a modulating transistor, wherein when the modulating transistor of the first device is activated another current increases in the second device, thereby deactivating the modulating transistor of the second device.

13. The apparatus of claim 12, wherein
each of the at least two devices further include a sense transistor, wherein when the modulating transistor of the second device is deactivated, the sense transistor of the second device is activated, thereby enabling a detection of increased current flow through the second device.

14. The apparatus of claim 11, wherein
the second device indicates a subsequent data transfer upon a completion of the transfer of data from the first device.

15. The apparatus of claim 11, wherein
a plurality of devices are connected via the electrical bus line, and wherein the electrical bus line comprises a star topology.

16. The apparatus of claim 11, wherein
the at least two devices draw a quiescent current from the electrical bus line when no transfer of data occurs, and wherein each of the at least two devices include an idle resistor that facilitates that the quiescent current flows from the electrical bus line to ground.

17. The apparatus of claim 16, wherein the idle resistors of the respective at least two devices have different Ohmic resistances.

18. The apparatus of claim 11, wherein
the first device has priority over the second device for transferring the data to the electrical bus line, and wherein the second device is switched into a data receiving mode.

19. The apparatus of claim 11, wherein
transferring data includes, transmitting an address of a target device preceding a transmission of the data destined for the target device.

20. The apparatus of claim 11, wherein
each of the at least two devices includes a data interface to a processing unit, and wherein the at least two devices transfer interface data received from the data interface via the electrical bus line.

* * * * *